United States Patent
Iino et al.

(10) Patent No.: US 10,065,706 B2
(45) Date of Patent: Sep. 4, 2018

(54) BICYCLE COMPONENT FIXING STRUCTURE AND BICYCLE COMPONENT ASSEMBLY

(71) Applicant: Shimano Inc., Sakai, Osaka (JP)

(72) Inventors: Yoshinori Iino, Osaka (JP); Kazuhiro Fujii, Osaka (JP); Eiji Mishima, Osaka (JP)

(73) Assignee: Shimano Inc., Osaka (JP)

( * ) Notice: Subject to any disclaimer, the term of this patent is extended or adjusted under 35 U.S.C. 154(b) by 0 days.

(21) Appl. No.: 15/288,980

(22) Filed: Oct. 7, 2016

(65) Prior Publication Data
US 2017/0151993 A1    Jun. 1, 2017

(30) Foreign Application Priority Data

Nov. 27, 2015 (JP) ................. 2015-231613

(51) Int. Cl.
| | |
|---|---|
| B62M 25/00 | (2006.01) |
| F16M 13/02 | (2006.01) |
| H05K 5/00 | (2006.01) |
| H05K 5/02 | (2006.01) |
| B62J 99/00 | (2009.01) |

(52) U.S. Cl.
CPC ............ *B62M 25/00* (2013.01); *F16M 13/02* (2013.01); *H05K 5/0017* (2013.01); *H05K 5/0204* (2013.01); *B62J 99/00* (2013.01); *B62J 2099/0033* (2013.01)

(58) Field of Classification Search
CPC ........................ B62M 25/00; B62M 2025/003
See application file for complete search history.

(56) References Cited

U.S. PATENT DOCUMENTS

| | | | | |
|---|---|---|---|---|
| 3,522,745 A | * | 8/1970 | Milosevic | B62M 25/00 74/489 |
| 3,752,006 A | * | 8/1973 | Bartlett | B62M 25/00 74/489 |
| 5,572,907 A | * | 11/1996 | Kaakinen | B62K 23/04 74/424.89 |
| 6,340,338 B1 | | 1/2002 | Kamada | |

(Continued)

FOREIGN PATENT DOCUMENTS

JP    2001-010575 A    1/2001

*Primary Examiner* — Kevin Hurley
(74) *Attorney, Agent, or Firm* — Global IP Counselors, LLP

(57) ABSTRACT

A bicycle component fixing structure includes at least one bracket including at least one connecting portion and at least one fixing portion. The connecting portion is connected to the bicycle component. The fixing portion extends from the connecting portion and is fixed with respect to an outer peripheral surface of a cylindrical portion having an open end. The fixing portion includes at least one inner surface that opposes an outer peripheral surface of the cylindrical portion, and at least one outer surface that faces in the opposite direction from the inner surface. The fixing portion is fixed to the outer peripheral surface of the cylindrical portion by a pressing force that acts on the outer surface. The bracket fixes the bicycle component to the open end of the cylindrical portion, in a state in which the fixing portion is fixed to the outer peripheral surface of the cylindrical portion.

28 Claims, 12 Drawing Sheets

(56) References Cited

U.S. PATENT DOCUMENTS

| | | | |
|---|---|---|---|
| 7,871,189 B2* | 1/2011 | Li | B62J 6/00 |
| | | | 362/474 |
| 9,260,154 B2* | 2/2016 | Mauch | B62K 23/04 |
| 9,580,936 B2* | 2/2017 | Poehlmann | E05L 371/00 |
| 2016/0059931 A1 | 3/2016 | Fukunaga | |
| 2017/0080993 A1* | 3/2017 | Bierwerth | B62M 25/08 |
| 2017/0369125 A1* | 12/2017 | Katsura | B62M 25/08 |

* cited by examiner

BICYCLE COMPONENT FIXING STRUCTURE AND BICYCLE COMPONENT ASSEMBLY

CROSS-REFERENCE TO RELATED APPLICATIONS

This application claims priority to Japanese Patent Application No. 2015-231613, filed on Nov. 27, 2015. The entire disclosure of Japanese Patent Application No. 2015-231613 is hereby incorporated herein by reference.

BACKGROUND

Field of the Invention

The present invention relates to a bicycle component fixing structure and a bicycle component assembly.

Background Information

Conventionally, bicycle components, such as a rearview mirror and a shift operating device are known, which can be attached to a cylindrical portion of the bicycle having an open end. For example, a rearview device for a bicycle is disclosed in Japanese Published Unexamined Application No. 2001-010575, in which a mirror holder for holding a rearview mirror is installed on an end of a handlebar of a bicycle.

SUMMARY

It has been discovered that various fixing methods are conceivable for fixing a bicycle component to a cylindrical portion of the bicycle that has an open end. For example, a fixing method that uses a fastening member, such as a bolt, can be employed. However, these fixing methods typically require a tool when trying to fix the bicycle component held by a fastening member.

An object of the present invention is to provide a bicycle component fixing structure and a bicycle component assembly that are capable of improving the workability of an operation to fix a bicycle component.

A bicycle component fixing structure according to the present invention comprises at least one bracket including at least one connecting portion and at least one fixing portion. The at least one connecting portion is connected to the bicycle component. The at least one fixing portion extends from the at least one connecting portion and is fixed with respect to the outer peripheral surface of a cylindrical portion of the bicycle that has an open end. The at least one fixing portion comprises at least one inner surface that opposes the outer peripheral surface of the cylindrical portion, and at least one outer surface that faces in the opposite direction from the at least one inner surface. The at least one fixing portion is fixed to the outer peripheral surface of the cylindrical portion by a pressing force that acts on the at least one outer surface. The at least one bracket is configured to fix the bicycle component to an open end of the cylindrical portion in a state in which the at least one fixing portion is fixed to the outer peripheral surface of the cylindrical portion.

In this bicycle component fixing structure, the bicycle component is connected to the connecting portion and the inner surface of the fixing portion is attached to the outer peripheral surface of the cylindrical portion. Then, for example, a pressing force is applied to the outer surface of the fixing portion by winding a strip of tape, such as bar tape, on the outer surface of the fixing portion, in order to fix the fixing portion to the outer peripheral surface of the cylindrical portion; the bicycle component is thereby fixed to the cylindrical portion. Here, the inner surface of the fixing portion is configured to oppose the outer peripheral surface of the cylindrical portion; the fixing portion can be fixed to the cylindrical portion by applying a pressing force to the outer surface of the fixing portion. Accordingly, it is possible to provide a bicycle component fixing structure that is capable of improving the workability of an operation to fix a bicycle component. In addition, it is possible to easily and detachably attach the bicycle component to the cylindrical portion without using a tool.

The at least one bracket can comprise a first bracket and a second bracket. The at least one connecting portion can comprise a first connecting portion provided on the first bracket and a second connecting portion provided on the second bracket. The at least one fixing portion can comprise a first fixing portion provided on the first bracket and a second fixing portion provided on the second bracket. According to this configuration, each of the first bracket and the second bracket is connected to the bicycle component and fixed to the cylindrical portion. Accordingly, there are two connecting locations and fixing locations, allowing reliable connecting and fixing.

The first connecting portion and the second connecting portion can be connected to the bicycle component in a state in which a bicycle component is disposed between the first bracket and the second bracket. According to this configuration, a bicycle component can be connected to a bracket by sandwiching the bicycle component between the first bracket and the second bracket; therefore, the bicycle component can be easily connected to the bracket.

The bicycle component can comprise a connected portion that extends in a radial direction that is perpendicular to the direction in which a central axis of the cylindrical portion extends. The first connecting portion and the second connecting portion can be connected to the connected portion. According to this configuration, the movement of the bicycle component in the central axis direction can be regulated by connecting the first connecting portion and the second connecting portion to the connected portion.

The bicycle component can comprise an abutting portion that is provided on a surface that faces the direction in which a central axis of the cylindrical portion extends. The abutting portion can abut to the at least one connecting portion. According to this configuration, by abutting the connecting portion to the at least one connected portion and abutting the connected portion to the open end, the bicycle component can be positioned in the axial direction of the central axis even if the bracket is integrally formed.

The first fixing portion can comprise a first inner surface that faces the outer peripheral surface of the cylindrical portion and a first outer surface that faces in the direction opposite from the first inner surface. The second fixing portion can comprise a second inner surface that faces the outer peripheral surface of the cylindrical portion, and a second outer surface that faces in the direction opposite from the second inner surface. According to this configuration, a pressing force can act on the outer surfaces of the first fixing portion and the second fixing portion to fix the fixing portions to the cylindrical portion, by biasing the first outer surface and the second outer surface radially inwardly.

The first fixing portion and the second fixing portion can be fixed to the outer peripheral surface of the cylindrical portion by a first double-sided tape that is disposed between the first inner surface and the outer peripheral surface of the cylindrical portion, and a second double-sided tape that is disposed between the second inner surface and the outer peripheral surface of the cylindrical portion. According to this configuration, the fixing portions can be easily fixed to the cylindrical portion by the first double-sided tape and the second double-sided tape.

The first bracket can comprise a first abutting portion. The second bracket can comprise a second abutting portion. The first abutting portion can abut the second abutting portion in a state in which the bicycle component is fixed to the cylindrical portion. According to this configuration, since the first abutting portion abuts the second abutting portion in a state in which the bicycle component is fixed to the cylindrical portion, the first bracket and the second bracket can be positioned in a radial direction.

The first bracket and the second bracket can be independent and separate parts from each other. According to this configuration, since the first bracket and the second bracket are independent and separate parts from each other, the first bracket and the second bracket can be individually attached to the bicycle component.

The first bracket and the second bracket can be flexibly connected. According to this configuration, since the two brackets are connected, it is easy to manage the brackets.

The cylindrical portion can be a handlebar. According to this configuration, it is easy to fix the bicycle component to the handlebar.

The pressing force can be generated by winding a strip-shaped tape member onto at least one outer surface of the at least one fixing portion. According to this configuration, it is possible to easily generate a pressing force by winding the strip-shaped tape member onto the at least one outer surface of the fixing portion.

The bicycle component can comprise at least one of an operating unit, an electrical connection part, and a display unit. According to this configuration, it is possible to carry out at least one of an operation of another bicycle component, an electrical connection with another bicycle component, and a display of the state of the other bicycle component.

The bicycle component can be a bicycle power source that is configured to supply power to another bicycle component. According to this configuration, a bicycle power source that is fixed to the cylindrical portion can be easily charged.

The bicycle component assembly according to the present invention comprises a bicycle component and at least one bracket. The bicycle component comprises a connected portion and at least one of an operating unit, an electrical connection part, and a display unit.

The at least one bracket comprises at least one connecting portion that is connected to the bicycle component, and at least one fixing portion that extends from the at least one connecting portion and that is fixed with respect to the outer peripheral surface of a cylindrical portion of the bicycle that has an open end. The at least one fixing portion comprises at least one inner surface that opposes the outer peripheral surface of the cylindrical portion, and at least one outer surface that faces in the opposite direction from the at least one inner surface. The at least one fixing portion is fixed to the outer peripheral surface of the cylindrical portion by a pressing force that acts on the at least one outer surface. The at least one bracket is configured to fix a bicycle component to an open end of the cylindrical portion, in a state in which the at least one fixing portion is fixed to the outer peripheral surface of the cylindrical portion.

In this bicycle component assembly, the bicycle component is connected to the connecting portion, and the inner surface of the fixing portion is attached to the outer peripheral surface of the cylindrical portion of the bicycle. Then, for example, a pressing force is applied to the outer surface of the fixing portion by winding a strip of tape, such as a bar tape, on the outer surface of the fixing portion, in order to fix the fixing portion to the outer peripheral surface of the cylindrical portion; the bicycle component is thereby fixed to the cylindrical portion. Here, the inner surface of the fixing portion is configured to oppose the outer peripheral surface of the cylindrical portion; the fixing portion can be fixed to the cylindrical portion by applying a pressing force to the outer surface of the fixing portion. Accordingly, it is possible to provide a bicycle component assembly that is capable of improving the workability of an operation to fix a bicycle component. In addition, it is possible to easily and detachably attach the bicycle component to the cylindrical portion without using a tool.

The at least one bracket can comprise a first bracket and a second bracket. The at least one connecting portion can comprise a first connecting portion provided to the first bracket and a second connecting portion provided to the second bracket. The at least one fixing portion can comprise a first fixing portion provided on the first bracket and a second fixing portion provided on the second bracket. According to this configuration, each of the first bracket and the second bracket is connected to the bicycle component and fixed to the cylindrical portion. Accordingly, there are two connecting locations and fixing locations, allowing reliable connecting and fixing.

The first connecting portion and the second connecting portion can be connected to the bicycle component in a state in which a bicycle component is disposed between the first bracket and the second bracket. According to this configuration, a bicycle component can be connected to the bracket by sandwiching the bicycle component between the first bracket and the second bracket; therefore, the bicycle component can be easily connected to the bracket.

The bicycle component can comprise a connected portion that extends in a radial direction that is perpendicular to the direction in which the central axis of the cylindrical portion extends. The first connecting portion and the second connecting portion can be connected to the connected portion. According to this configuration, the movement of the bicycle component in the central axis direction can be regulated by connecting the first connecting portion and the second connecting portion to the connected portion.

The bicycle component can comprise an abutting portion that is provided on a surface that faces the direction in which the central axis of the cylindrical portion extends. The abutting portion can abut the at least one connecting portion. According to this configuration, by abutting the connecting portion to the abutting portion, the bicycle component can be positioned in the axial direction of the central axis, even if the bracket is integrally formed.

The first fixing portion can comprise a first inner surface that faces the outer peripheral surface of the cylindrical portion and a first outer surface that faces in the direction opposite to the first inner surface. The second fixing portion can comprise a second inner surface that faces the outer peripheral surface of the cylindrical portion and a second outer surface that faces in the direction opposite to the second inner surface. According to this configuration, a pressing force can act on the outer surfaces of the first fixing portion and the second fixing portion to fix the fixing portions to the cylindrical portion by biasing the first outer surface and the second outer surface radially inwardly.

The first fixing portion and the second fixing portion can be fixed to the outer peripheral surface of the cylindrical portion by a first double-sided tape that is disposed between the first inner surface and the outer peripheral surface of the cylindrical portion, and a second double-sided tape that is disposed between the second inner surface and the outer peripheral surface of the cylindrical portion. According to this configuration, the fixing portions can be easily fixed to the cylindrical portion by the first double-sided tape and the second double-sided tape.

The first bracket can comprise a first abutting portion. The second bracket can comprise a second abutting portion. The first abutting portion can abut the second abutting portion in a state in which the bicycle component is fixed to the cylindrical portion. According to this configuration, since the first abutting portion abuts the second abutting portion in a state in which the bicycle is fixed to the cylindrical portion, the first bracket and the second bracket can be positioned in the radial direction.

The first bracket and the second bracket can be independent and separate parts from each other. According to this configuration, since the first bracket and the second bracket are independent and separate parts from each other, the first bracket and the second bracket can be individually attached to the bicycle component.

The first bracket and the second bracket can be flexibly connected. According to this configuration, since the two brackets are connected, it is easy to manage the brackets.

The cylindrical portion can be a handlebar. According to this configuration, it is easy to fix the bicycle component to the handlebar.

The pressing force can be generated by winding a strip-shaped tape member onto at least one outer surface of at least one fixing portion. According to this configuration, it is possible to easily generate a pressing force by winding a strip-shaped tape member onto the at least one outer surface of the fixing portion.

The bicycle component can be a bicycle power source that is configured to supply power to another bicycle component. According to this configuration, a bicycle power source that is fixed to the cylindrical portion can be easily charged.

The bicycle component fixing structure according to another aspect of the present invention comprises at least one connecting portion that is connected to the bicycle component, and at least one bracket comprising at least one fixing portion that extends from the at least one connecting portion, and that is fixed with respect to the outer peripheral surface of a cylindrical portion of the bicycle that has an open end. The at least one fixing portion comprises at least one inner surface that opposes the outer peripheral surface of the cylindrical portion, and at least one outer surface that faces in the opposite direction from the at least one inner surface, in which the maximum distance between the at least one inner surface and the at least one outer surface in a radial direction that is perpendicular to the direction in which the central axis of the cylindrical portion extends is less than, or equal to, 5 millimeters.

In this bicycle component fixing structure, the bicycle component is connected to the connecting portion, and the inner surface of the fixing portion is attached to the outer peripheral surface of the cylindrical portion. Then, for example, the fixing portion is fixed to the outer peripheral surface of the cylindrical portion by winding a strip of tape, such as bar tape, on the outer surface of the fixing portion; the bicycle component is thereby fixed to the cylindrical portion. Here, the inner surface of the fixing portion is configured to oppose the outer peripheral surface of the cylindrical portion; the fixing portion can be fixed to the cylindrical portion by applying a pressing force to the outer surface of the fixing portion. Accordingly, it is possible to detachably attach the bicycle component to the cylindrical portion without using a tool. Further, since the distance between the inner surface and the outer surface of the fixing portion, i.e., the thickness, is small, it is possible to keep the diameter of the cylindrical portion from becoming large, even if a strip of tape is wound onto the outer surface of the fixing portion to fix the bracket to the cylindrical portion.

According to the present invention, it is possible to provide a bicycle component fixing structure and a bicycle component assembly that are capable of improving the workability of an operation to fix a bicycle component.

DETAILED DESCRIPTION OF EMBODIMENTS

Selected embodiments will now be explained with reference to the drawings. It will be apparent to those skilled in the bicycle field from this disclosure that the following descriptions of the embodiments are provided for illustration only and not for the purpose of limiting the invention as defined by the appended claims and their equivalents.

First Embodiment

Figure 1:
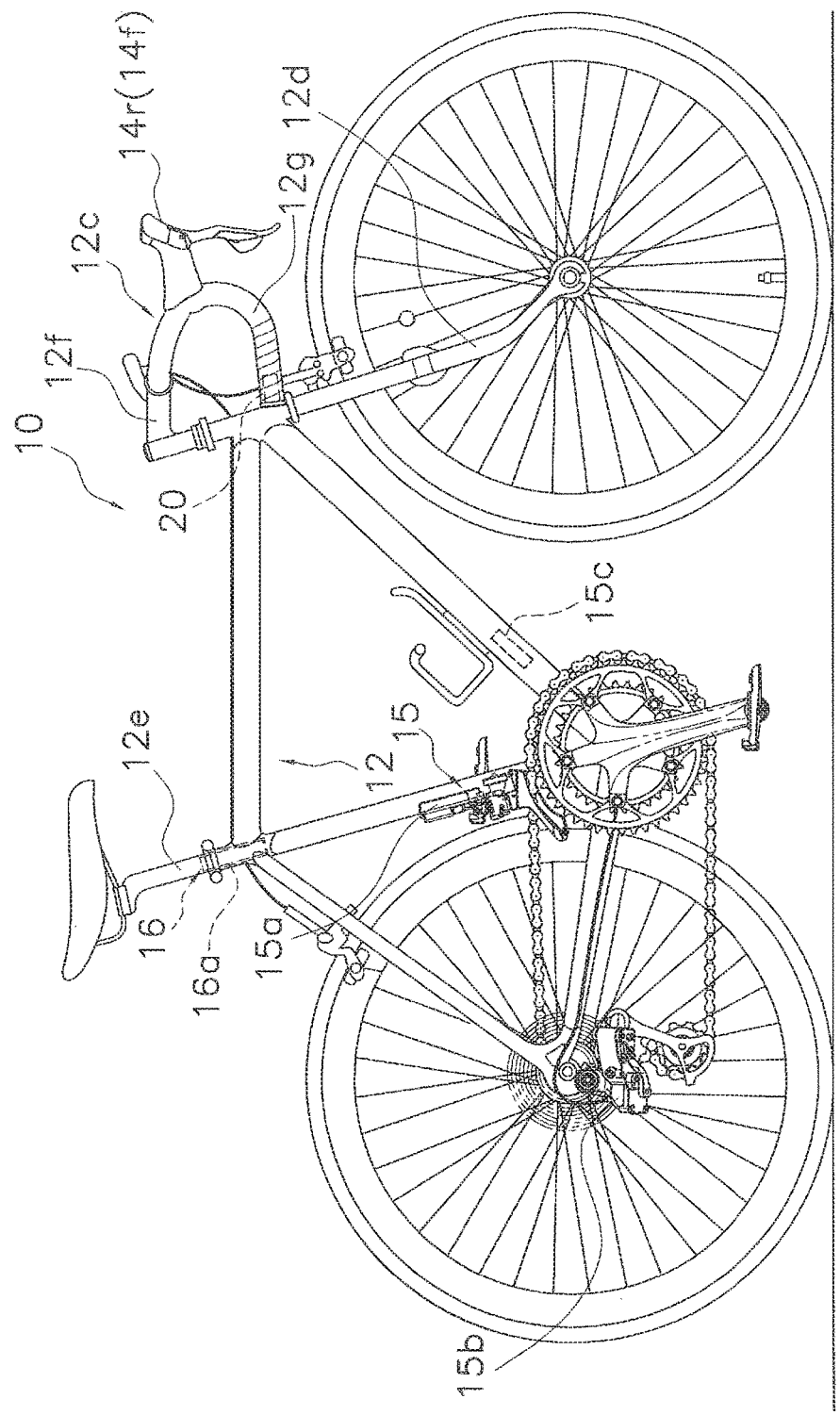
FIG. 1 is a side elevational view of a bicycle equipped with a bicycle component assembly according to a first embodiment.
Figure 2:
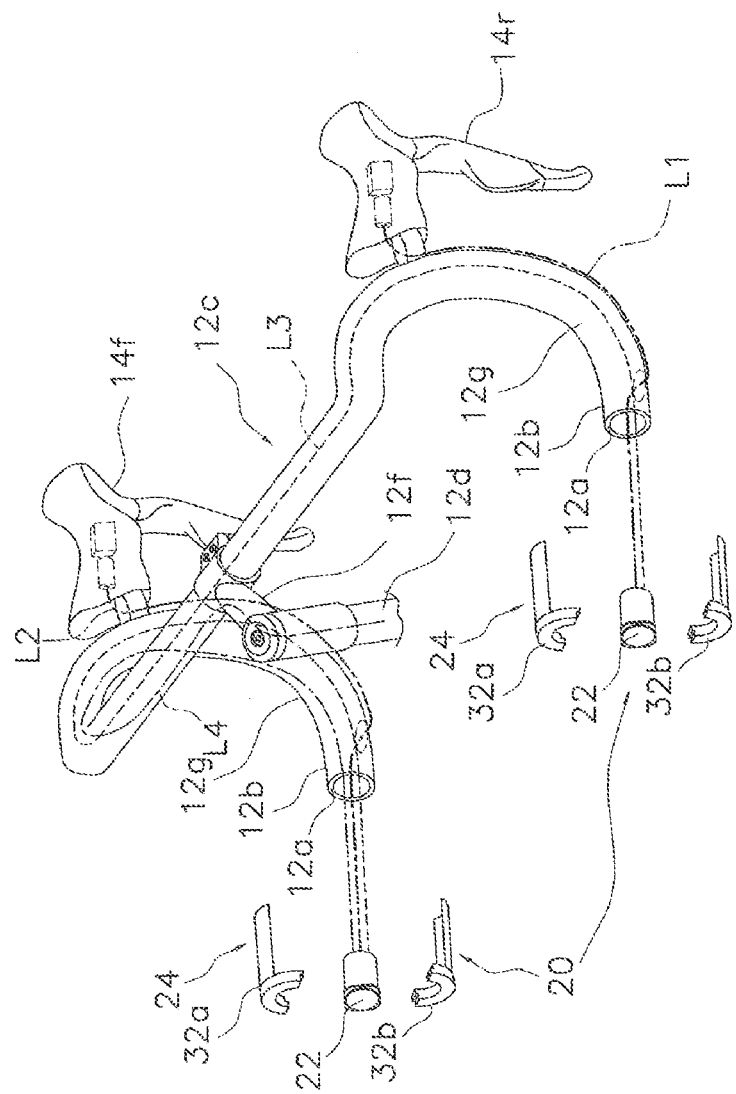
FIG. 2 is a partially exploded perspective view of a portion of the bicycle showing the bicycle handlebar and the bicycle component assembly illustrated in FIG. 1.

As shown in FIG. 1, a bicycle 10 is illustrated having a bicycle body 12 equipped with a bicycle component assembly 20 in accordance with a first embodiment. The bicycle component assembly 20 is configured to be attached to the bicycle body 12 of a bicycle 10. The bicycle body 12 comprises a handlebar 12c having a cylindrical portion 12b (FIG. 2) with an open end 12a. The bicycle body 12 further comprises a front fork 12d, a seat post 12e and a handle stem 12f. As shown in FIG. 2, in the first embodiment, the handlebar 12c is a hollow drop handlebar having two curved portions 12g that are curved in a U-shape. The handlebar 12c comprises a cylindrical portion 12b that has an open end 12a. The handlebar 12c is not limited to a drop handlebar, and can be a hollow bicycle handlebar of various shapes.

As shown in FIG. 1, the bicycle 10 further comprises a bicycle transmission device 15 that can be electrically controlled. The bicycle transmission device 15 preferably comprises an electric front derailleur 15a and an electric rear derailleur 15b. The electric front derailleur 15a is mounted in a central portion of the bicycle body 12. The electric rear derailleur 15b is mounted in a rear portion of the bicycle body 12. More preferably, the bicycle transmission device 15 comprises a transmission controller 15c. The transmission controller 15c is configured to transmit a shift control signal to the electric rear derailleur 15b based on inputs from a rear gear shift operating device 14r. The transmission controller 15c is also configured to transmit a shift control signal to the electric front derailleur 15a based on inputs from a front gear shift operating device 14f. The rear front gear shift operating devices 14r and 14f are mounted on the handlebar 12c. The bicycle 10 further comprises a bicycle power source 16 that can be recharged. The bicycle power source 16 is included in a bicycle component. Preferably, the bicycle power source 16 comprises a power supply unit 16a that is housed inside a seat post 12e that has a cylindrical portion. The bicycle power source 16 is one example of a bicycle component. The bicycle power source 16 is configured to supply power to another bicycle component, such as the bicycle transmission device 15 and the transmission controller 15c. In FIG. 1, the bicycle power source 16 is fixed to the seat post 12e, but can be fixed to the cylindrical portion 12b of the handlebar 12c as described later.

Figure 3:
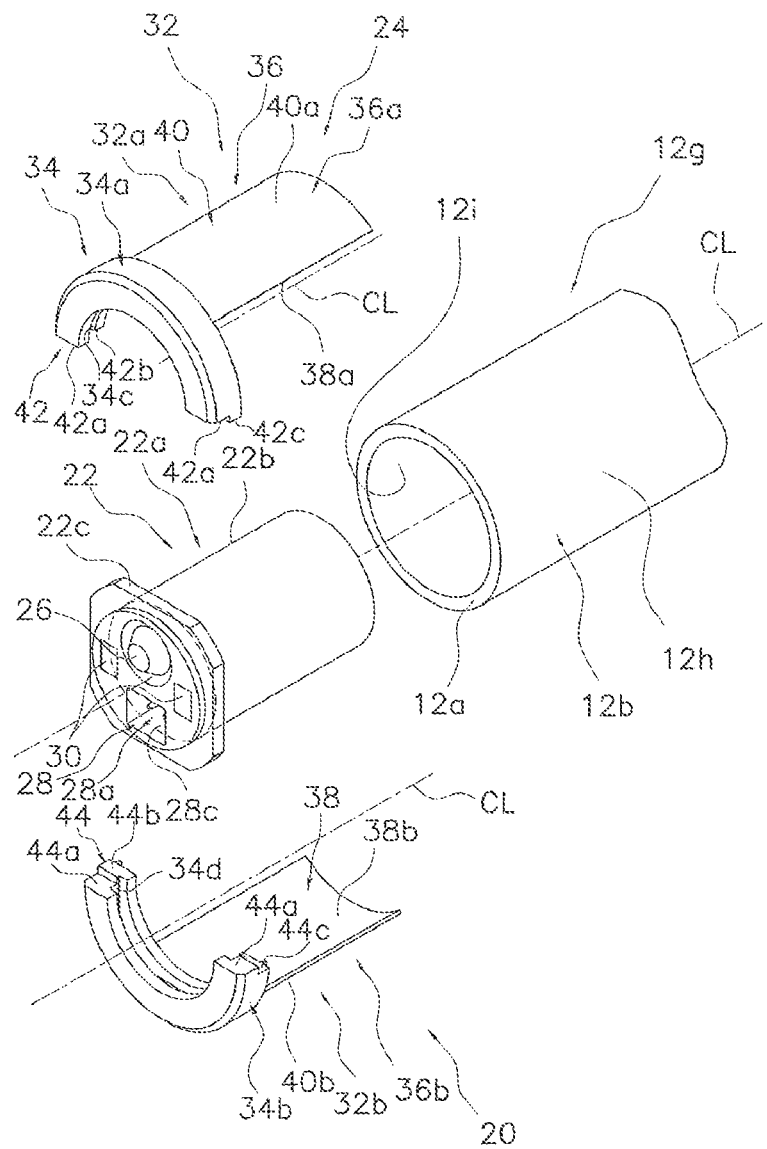
FIG. 3 is an exploded perspective view of the bicycle component assembly illustrated in FIGS. 1 and 2.
Figure 4:
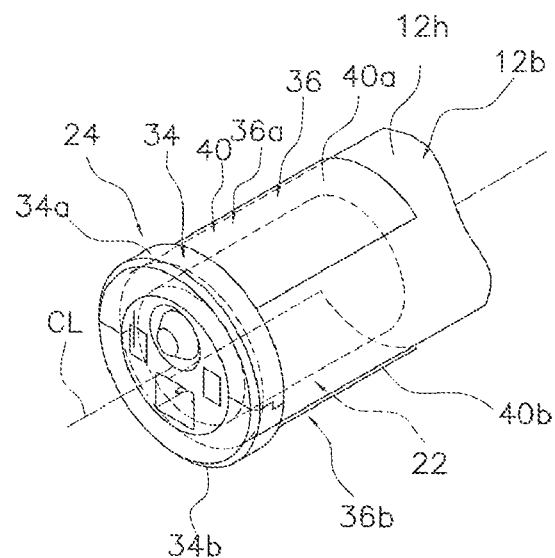
FIG. 4 is a perspective view of the bicycle component assembly illustrated in FIGS. 1 to 3.
Figure 5:
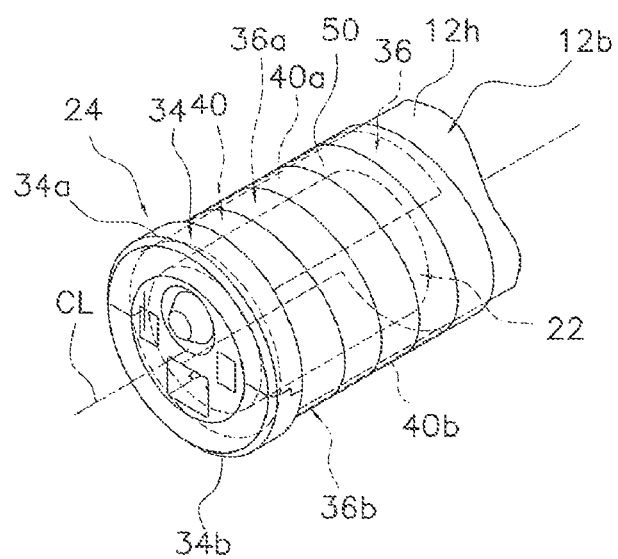
FIG. 5 is a perspective view of the bicycle component assembly illustrated in FIGS. 1 to 4 showing a state in which the bicycle component assembly is fixed to the bicycle.

As shown in FIGS. 2 and 3, the bicycle component assembly 20 according to the first embodiment comprises a bicycle component 22 and a bicycle component fixing structure 24. The bicycle component 22 is fixed to the open end 12a of the cylindrical portion 12b of the handlebar 12c by the bicycle component fixing structure 24. As shown in FIG. 3, the cylindrical portion 12b of the handlebar 12c has an outer peripheral surface 12h and an inner peripheral surface 12i.

Configuration of the Bicycle Component

As shown in FIGS. 3 to 9, the bicycle component 22 comprises a component body 22a and at least one operating unit 26, an electrical connection part 28 and a display unit 30. In the first embodiment, the bicycle component 22 comprises all of the operating unit 26, the electrical connection part 28 and the display unit 30.

The operating unit 26 comprises at least one switch 26a that is used for operating another bicycle component. For example, the operating unit 26 is configured to output a mode transition signal of the bicycle transmission device 15 to the transmission controller 15c. A mode transition signal is a signal for transitioning the operation mode of the bicycle transmission device 15 to a front adjustment mode for finely adjusting the position of the electric front derailleur 15a. However, the mode transition signal is not limited to a signal for transitioning the electric front derailleur 15a to a front adjustment mode. In particular, the mode transition signal can be a signal for transitioning to at least one operation mode from among a rear adjustment mode for finely adjusting the position of the electric rear derailleur 15b, a manual shift mode for independently executing the shifting operation of each of the electric front derailleur 15a and the electric rear derailleur 15b, and a synchro shift mode for executing each shifting operation of the electric front derailleur 15a and the electric rear derailleur 15b in cooperation. The bicycle component 22 communicates with other bicycle components by a standard compliant with the power line communication (Power Line Communication: PLC) standard, utilizing a two-conductor power line.

The electrical connection part 28 comprises a receiving part 28a and at least one communication unit 28b. The receiving part 28a is configured to be electrically connected to an unillustrated electrical connector that is electrically connected to an external device. The at least one communication unit 28b can be electrically connected to another bicycle component. For example, the electrical connector can be a plug at the end of a two-conductor power line, and the receiving part 28a can be a socket 28c that is provided on an axial end of the component body 22a on the side adjacent to the open end 12a, as shown in FIG. 3. In this way, the unillustrated plug can be electrically connected to the receiving part 28a. As shown in FIGS. 6 to 9, the communication unit 28b is provided on an axial end of the component body 22a that is located inside the cylindrical portion 12b of the handlebar 12c. The communication unit 28b comprises at least one communication socket 28d. In the first embodiment, one of two of the bicycle components 22 comprises three communication sockets 28d in the communication unit 28b, and the other comprises two communication sockets 28d. Each of the communication sockets 28d is configured to be electrically connected to a plug that is provided on both ends of a two-conductor electrical wire that conforms to power line communication standards.

For example, in FIG. 2, the bicycle component 22 having three communication sockets 28d is attached to the cylindrical portion 12b of the handlebar 12c that is on the left side when viewed from the rear of the bicycle 10 in the traveling direction of the bicycle 10. Further, the bicycle component 22 having two communication sockets 28d is attached to the cylindrical portion 12b on the right side when viewed from the rear of the bicycle 10 in the traveling direction of the bicycle 10. In the example shown in FIG. 2, the rear gear shift operating device 14r on the right side, when viewed from the rear of the bicycle 10 in the traveling direction of the bicycle 10, is electrically connected to the bicycle component 22 having two communication sockets 28d, by an electrical wire L1 shown by the dashed line. Further, the front gear shift operating device 14 on the left side, when viewed from the rear of the bicycle 10 in the traveling direction of the bicycle 10, is electrically connected to the bicycle component 22 having three communication sockets 28d, by an electrical wire L2 shown by the double-chain dashed line. Furthermore, both of the bicycle components 22 are electrically connected by an electrical wire L3 shown by the broken line that passes inside the handlebar 12c, and the bicycle component 22 on the left side is electrically connected to the transmission controller 15c by an electrical wire L4 shown by the dashed line.

The display unit 30 is formed of, for example, two light-emitting diodes 30a that are capable of multi-color light emission, and emit light with a color corresponding to the mode at the time of the shift control. External devices include communication terminal devices, such as charging devices, personal computers, tablets, and smart phones.

Figure 6:
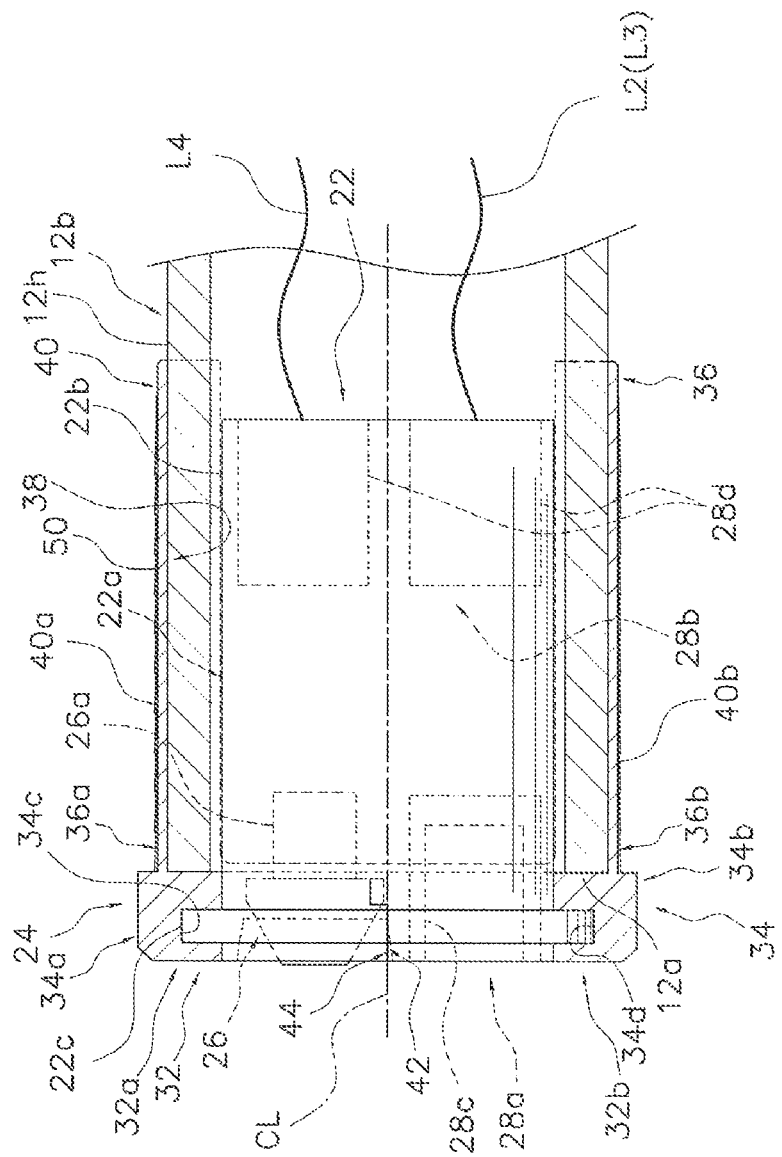
FIG. 6 is a longitudinal cross-sectional view of a portion of the bicycle handlebar and the bicycle component assembly illustrated in FIGS. 1 to 5.
Figure 7:
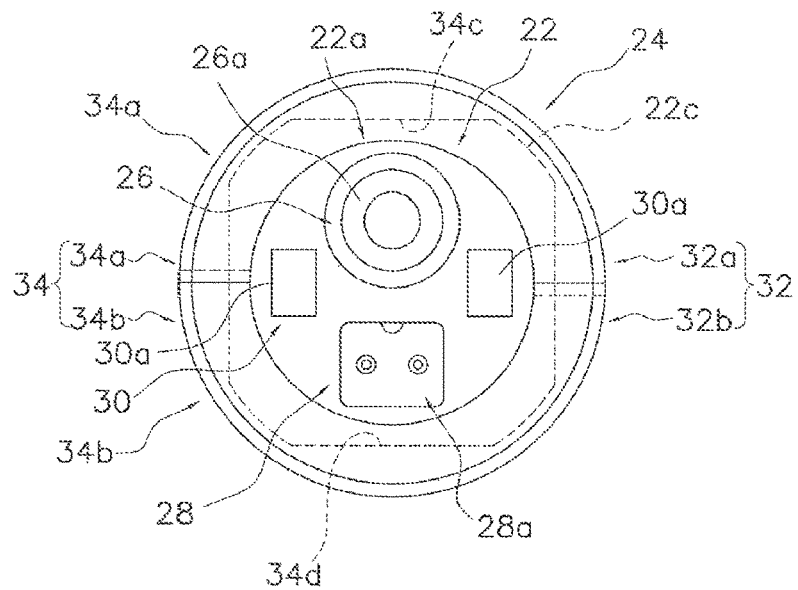
FIG. 7 is an end elevational view of an exposed face of the bicycle component assembly illustrated in FIGS. 1 to 6.
Figure 8:
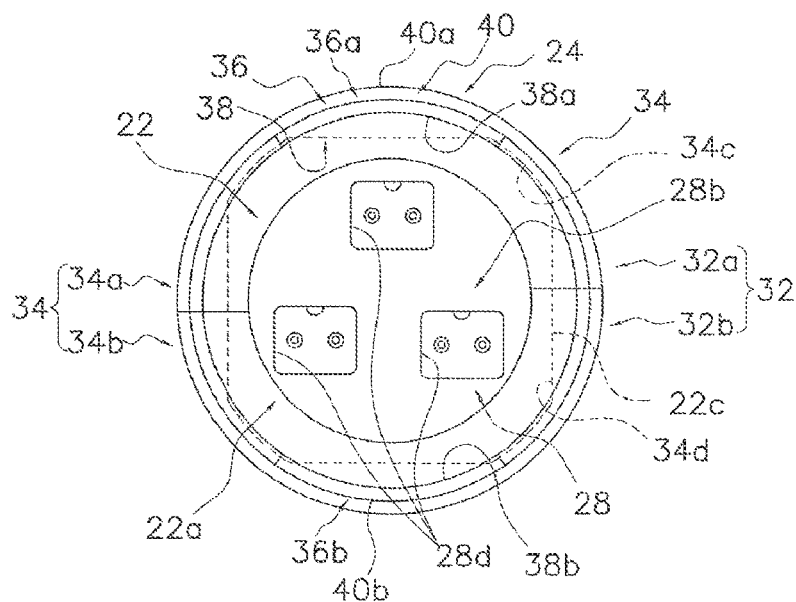
FIG. 8 is an end elevational view of a concealed face of the bicycle component assembly illustrated in FIGS. 1 to 7.
Figure 9:
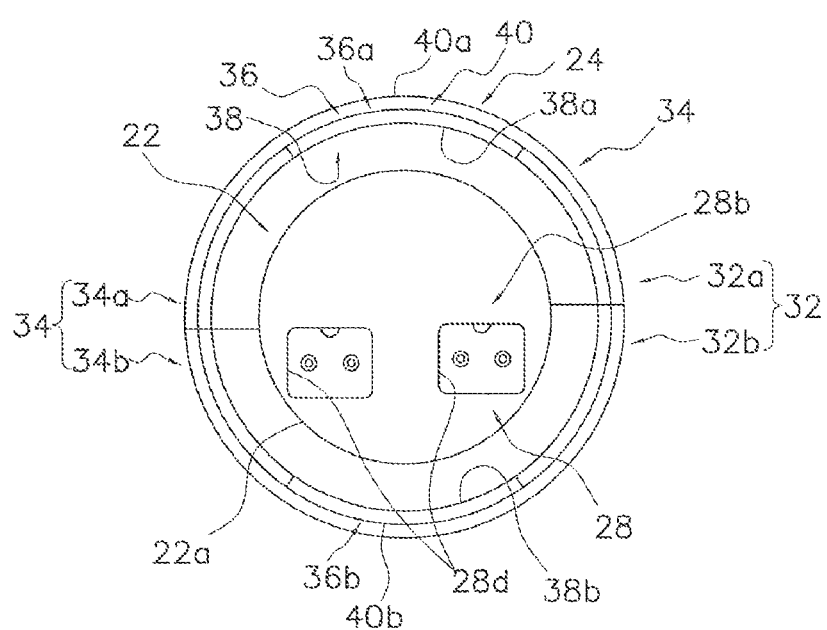
FIG. 9 is an end elevational view of a concealed face of another bicycle component assembly.

As shown in FIG. 6, the component body 22a comprises a main body portion 22b and a connected portion. The main body portion 22b is at least partially cylindrical. The connected portion 22c is integrally formed with the main body portion 22b. The distal end portion of the main body portion 22b protrudes slightly from the open end 12a in an axial direction that is parallel to the direction in which the central axis CL of the cylindrical portion 12b extends from the connected portion 22c. The connected portion 22c extends from the outer peripheral surface of the main body portion 22b in a radial direction that is perpendicular to the direction in which the central axis CL of the cylindrical portion 12b extends. In the first embodiment, the connected portion 22c is a flange-shaped portion that is larger than the main body portion 22b, and is formed in a non-circular shape in which the four corners of a square are rounded in arcuate shapes.

Configuration of the Bicycle Component

As shown in FIGS. 3 to 6, the bicycle component fixing structure 24 comprises at least one bracket 32. The at least one bracket 32 comprises at least one connecting portion 34 and at least one fixing portion 36. The at least one connecting portion 34 is connected to the connected portion 22c of the bicycle component 22. The at least one fixing portion 36 extends from the at least one connecting portion 34, and is fixed with respect to the outer peripheral surface 12h of the cylindrical portion 12b having the open end 12a. The at least one fixing portion 36 comprises at least one inner surface 38 that opposes the outer peripheral surface 12h of the cylindrical portion 12b, and at least one outer surface 40 that faces in the opposite direction from the at least one inner surface 38. The at least one fixing portion 36 is fixed to the outer peripheral surface 12h of the cylindrical portion 12b by a pressing force that acts on the at least one outer surface 40. The at least one bracket 32 is configured to fix the bicycle component 22 to the open end 12a of the cylindrical portion 12b, in a state in which the at least one fixing portion 36 is fixed to the outer peripheral surface 12h of the cylindrical portion 12b on the open end 12a side of the component body 22a.

In the first embodiment, the at least one bracket 32 comprises a first bracket 32a and a second bracket 32b. The first bracket 32a and the second bracket 32b are substantially the same shape in the first embodiment, and the first bracket 32a and the second bracket 32b are independent and separate parts from each other.

The at least one connecting portion 34 comprises a first connecting portion 34a provided on the first bracket 32a and a second connecting portion 34b provided on the second bracket 32b. The first connecting portion 34a and the second connecting portion 34b are each formed in a semicircular shape. The first connecting portion 34a comprises a first groove 34c that engages the connected portion 22c, and the second connecting portion 34b comprises a second groove 34d that engages the connected portion 22c. The first groove 34c and the second groove 34d comprise a straight portion and an arcuate portion that engage the outer peripheral surface of the connected portion 22c (refer to FIG. 7 and FIG. 8). The bicycle component 22 is thereby prevented from rotating relative to the connecting portion 34.

The first connecting portion 34a and the second connecting portion 34b are connected to the bicycle component 22 in a state in which the bicycle component 22 is disposed between the first bracket 32a and the second bracket 32b. Specifically, the first connecting portion 34a and the second connecting portion 34b are connected to the connected portion 22c of the bicycle component 22.

The first bracket 32a comprises a first abutting portion 42. The second bracket 32b comprises a second abutting portion 44. The first abutting portion 42 abuts the second abutting portion 44 in a state in which the bicycle component 22 is fixed to the cylindrical portion 12b.

In the first embodiment, the first abutting portion 42 is provided on the first connecting portion 34a of the first bracket 32a, and the second abutting portion 44 is provided on the second connecting portion 34b of the second bracket 32b. The first abutting portion 42 comprises a pair of first abutting surfaces 42a, a second abutting surface 42b and a third abutting surface 42c. The second abutting surface 42b is disposed adjacent to one of the first abutting surfaces 42a, and is formed more recessed in the circumferential direction than the first abutting surface 42a. The third abutting surface 42c is disposed adjacent to the other first abutting surface 42a. The third abutting surface 42c is formed more protruding in the circumferential direction than the first abutting surface 42a. A step is formed between one of the first abutting surfaces 42a and the second abutting surface 42b, and between the other first abutting surface 42a and the third abutting surface 42c.

The second abutting portion 44 comprises a pair of fourth abutting surfaces 44a, a fifth abutting surface 44b and a sixth abutting surface 44c. The fifth abutting surface 44b is disposed adjacent to one of the fourth abutting surfaces 44a. The fifth abutting surface 44b is formed more protruding in the circumferential direction than the fourth abutting surface 44a. The sixth abutting surface 44c is disposed adjacent to the other fourth abutting surface 44a. The sixth abutting surface 44c is formed more recessed in the circumferential direction than the fourth abutting surface 44a. A step is formed between one of the fourth abutting surfaces 44a and the fifth abutting surface 44b, and between the other fourth abutting surface 44a and the sixth abutting surface 44c. As described above, by configuring the first abutting portion 42 and the second abutting portion 44, when the first connecting portion 34a is abutted to the second connecting portion 34b, the first connecting portion 34a and the second connecting portion 34b are arranged along the central axis CL. Accordingly, it becomes easy to position the first bracket 32a and the second bracket 32b. Furthermore, the first bracket 32a and the second bracket 32b can be formed in substantially the same shape.

The at least one fixing portion 36 comprises a first fixing portion 36a provided on the first bracket 32a and a second fixing portion 36b provided on the second bracket 32b. The first fixing portion 36a and the second fixing portion 36b are plate-shaped members. Each of the first fixing portion 36a and the second fixing portion 36b is curved in an arcuate shape centered on the central axis CL. The first fixing portion 36a comprises a first inner surface 38a and a first outer surface 40a. The first inner surface 38a faces the outer peripheral surface 12h of the cylindrical portion 12b. The a first outer surface 40a faces in the direction opposite from the first inner surface 38a. The second fixing portion 36b comprises a second inner surface 38b and a second outer surface 40b. The second inner surface 38b faces the outer peripheral surface 12h of the cylindrical portion 12b. The second outer surface 40b faces in the direction opposite from the second inner surface 38b. The first fixing portion 36a and the second fixing portion 36b are arranged opposing each other in the radial direction that is perpendicular to the direction in which the central axis CL extends. The maximum distance between the first inner surface 38a and the first outer surface 40a in the radial direction that is perpendicular to the direction in which the central axis CL of the cylindrical portion 12b extends, that is the thickness of the first fixing portion 36a, is less than or equal to 5 millimeters. The maximum distance between the first inner surface 38a and the first outer surface 40a in the radial direction that is perpendicular to the direction in which the central axis CL of the cylindrical portion 12b extends is preferably less than or equal to 2 millimeters, and more preferably greater than or equal to 0.5 millimeters and less than or equal to 2 millimeters. Similarly, the maximum distance between the second inner surface 38b and the second outer surface 40b in the radial direction that is perpendicular to the direction in which the central axis CL of the cylindrical portion 12b extends, that is, the thickness of the second fixing portion 36b, is less than or equal to 5 millimeters. The maximum distance between the second inner surface 38b and the second outer surface 40b in the radial direction that is perpendicular to the direction in which the central axis CL of the cylindrical portion 12b extends is preferably less than or equal to 2 millimeters, and more preferably greater than or equal to 0.5 millimeters and less than or equal to 2 millimeters. The first fixing portion 36a and the second fixing portion 36b are fixed to the outer peripheral surface 12h of the cylindrical portion 12b by a pressing force that acts on the first outer surface 40a and the second outer surface 40b. This pressing force is, for example, generated by winding bar tape 50, as a strip-shaped tape member that has stretchability that can be wound onto the handlebar 12c, onto the at least one outer surface 40 of the at least one fixing portion 36. Accordingly, since normally, the bicycle component 22 can be fixed to the cylindrical portion 12b by using bar tape 50 that is wound to the outer peripheral surface of the handlebar 12c, the bicycle component 22 can be easily fixed. Further, it is possible to easily generate a pressing force by only winding the bar tape 50 on at least one outer surface 40 of the fixing portion 36.

Bicycle Component Assembly Fixing Procedure

When fixing the bicycle component 22 to the cylindrical portion 12b of the bicycle in the state shown in FIG. 3, for example, the electrical wires L2, L3 and L4 are connected to the communication unit 28b of the bicycle component 22 in advance. In this state, the first bracket 32a and the second bracket 32b are connected to the bicycle component 22. At this time, the first groove 34c of the first connecting portion 34a and the second groove 34d of the second connecting portion 34b are engaged with the connected portion 22c. The first bracket 32a and the second bracket 32b are thereby connected to the bicycle component 22. At this time, the first abutting portion 42 is abutted to the second abutting portion 44. The bicycle component assembly 20 is thereby assembled. When the bicycle component assembly 20 is assembled, the bicycle component 22 is inserted in the cylindrical portion 12b in the assembled state, and the first inner surface 38a of the first fixing portion 36a and the second inner surface 38b of the second fixing portion 36b are engaged with the outer peripheral surface 12h of the cylindrical portion 12b. Then, the bicycle component assembly 20 is pressed until the rear faces of the first connecting portion 34a and the second connecting portion 34b contact the open end 12a. Finally, the bar tape 50 is wound until the first outer surface 40a of the first fixing portion 36a and the second outer surface 40b of the second fixing portion 36b are hidden. The bicycle component 22 is thereby fixed to the cylindrical portion 12b.

Here, the bicycle component 22 can be detachably attached to the cylindrical portion 12b without using a tool. The workability of an operation to fix the bicycle component 22 can thereby be improved, and it is possible to provide a bicycle component fixing structure 24 and a bicycle component assembly 20 that is detachable with respect to the cylindrical portion 12b. The first bracket 32a and the second bracket 32b can be connected to the bicycle component 22 in a state in which a part of the component body 22a of the bicycle component 22 is inserted in the cylindrical portion 12b, after connecting, for example, the electrical wires L2, L3 and L4 to the communication unit 28b of the bicycle component 22 in advance.

First Modification

In the following description, members with the same configurations as the first embodiment are given the same reference symbols as the first embodiment, while corresponding members that are configured differently are given three-digit reference symbols obtained by adding the hundreds place to the reference symbols of the first embodiment.

Figure 10:
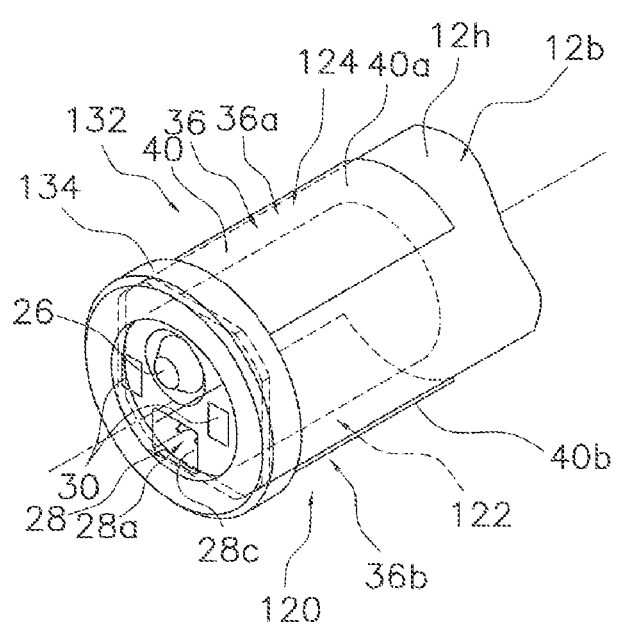
FIG. 10 is a perspective view of a bicycle component assembly according to a first modification of the first embodiment.

In the first embodiment, the bracket 32 of the bicycle component fixing structure 24 comprises the first bracket 32a and the second bracket 32b which are independent and separate parts. However, in a bicycle component assembly 120 of the first modification shown in FIG. 10, a bracket 132 of a bicycle component fixing structure 124 is integrally formed. Therefore, a connecting portion 134 is also integrally formed.

Figure 11:
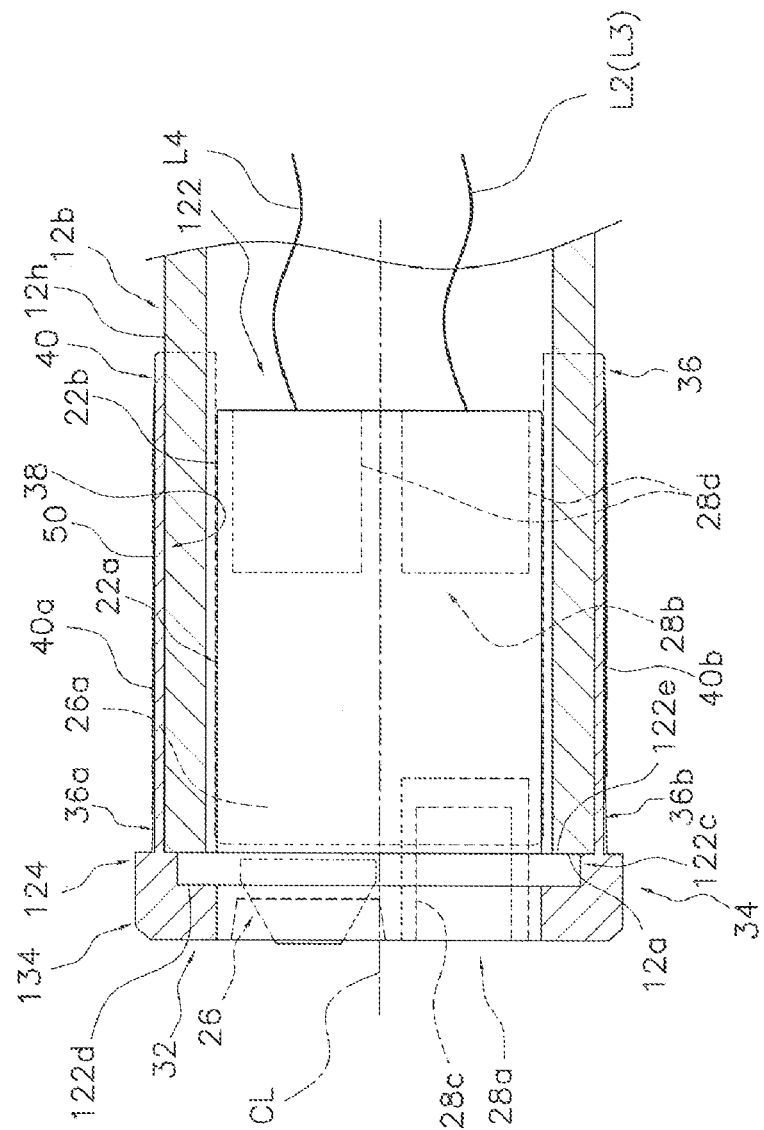
FIG. 11 is a longitudinal cross sectional view of the bicycle component assembly according to the first modification of the first embodiment.

As shown in FIG. 11, a bicycle component 122 comprises an abutting portion 122d that is provided on a surface that faces the direction in which the central axis CL of the cylindrical portion 12b extends in the connected portion 122c. The abutting portion 122d abuts the connecting portion 134. Specifically, the abutting portion 122d abuts an annular contact surface 134e that is provided on the connecting portion 134 of the bicycle component fixing structure 124. Unlike the first embodiment, the connected portion 122c is provided so as to be abuttable to the open end 12a. Specifically, the abutting portion 122d of the connected portion 122c and the back surface 122e on the opposite side abut the open end 12a. In a bicycle component fixing structure 124 configured in this manner, the bicycle component 122 can be positioned in the axial direction of the central axis CL by fixing the bicycle component fixing structure 124 to the cylindrical portion 12b by bar tape 50 or the like, even if the bracket 132 is integrally formed.

Second Modification

Figure 12:
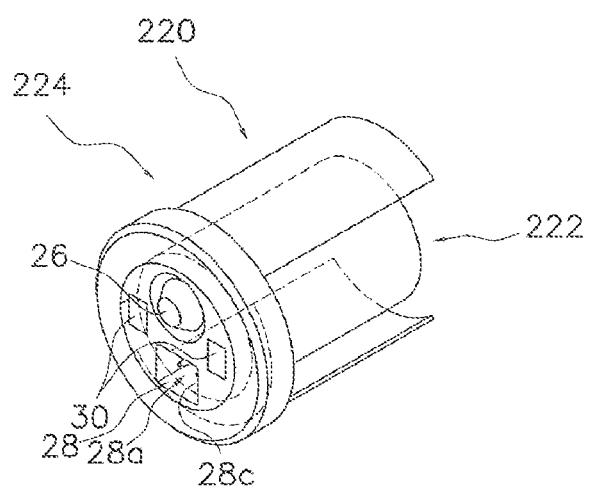
FIG. 12 is a perspective view of a bicycle component assembly according to a second modification of the first embodiment.

In a bicycle component assembly 220 of the second modification shown in FIG. 12, a bicycle component 222 and a bicycle component fixing structure 224 are integrally formed. According to this configuration, since there is no need for an operation to connect the bicycle component 222 and the bicycle component fixing structure 224, the operation to fix the bicycle component assembly 220 is further facilitated.

Third Modification

Figure 13:
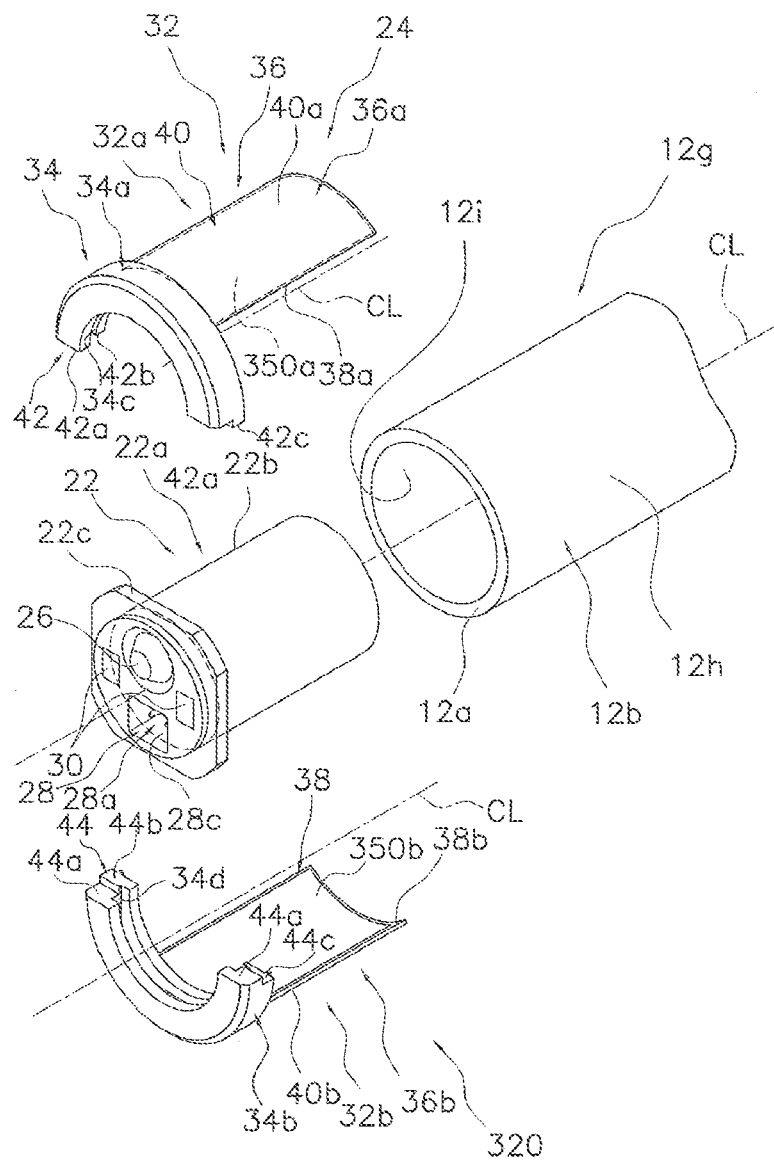
FIG. 13 is an exploded perspective view of a bicycle component assembly according to a third modification of the first embodiment.

In the first embodiment, the bicycle component 22 is fixed by bar tape 50 which is a strip-shaped tape member, but the present invention is not limited thereto. In the third modification, as shown in FIG. 13, a bicycle component assembly 320 is fixed to the cylindrical portion 12b by a first double-sided tape 350a and a second double-sided tape 350b. The first double-sided tape 350a is adhered to the first inner surface 38a of the first fixing portion 36a. The second double-sided tape 350b is adhered to the second inner surface 38b of the second fixing portion 36b.

In the bicycle component assembly 320 configured in this manner, first, a part of the component body of the bicycle component 22 is inserted in the cylindrical portion 12b so that the connected portion 22c protrudes from the open end 12a. Next, the first bracket 32a, to which is adhered the first double-sided tape 350a, is disposed on the outer peripheral surface 12h of the cylindrical portion 12b so that the back face of the first connecting portion 34a contacts the open end 12a. Next, the first fixing portion 36a is fixed to the outer peripheral surface 12h by the first double-sided tape 350a. Subsequently, the connected portion 22c of the bicycle component 22 is engaged with the first groove 34c of the first connecting portion 34a of the first bracket 32a, which is fixed. In this state, the second bracket 32b to which is adhered the second double-sided tape 350b is disposed on the outer peripheral surface 12h of the cylindrical portion 12b so that the back face of the second connecting portion 34b contacts the open end 12a; the connected portion 22c of the bicycle component 22 is engaged with the second groove 34d of the second connecting portion 34b; and the second fixing portion 36b is fixed to the outer peripheral surface 12h by the second double-sided tape 350b. The bicycle component 22 is thereby fixed to the cylindrical portion 12b. The bar tape 50 can be further wound to the first fixing portion 36a and the second fixing portion 36b.

Fourth Modification

Figure 14:
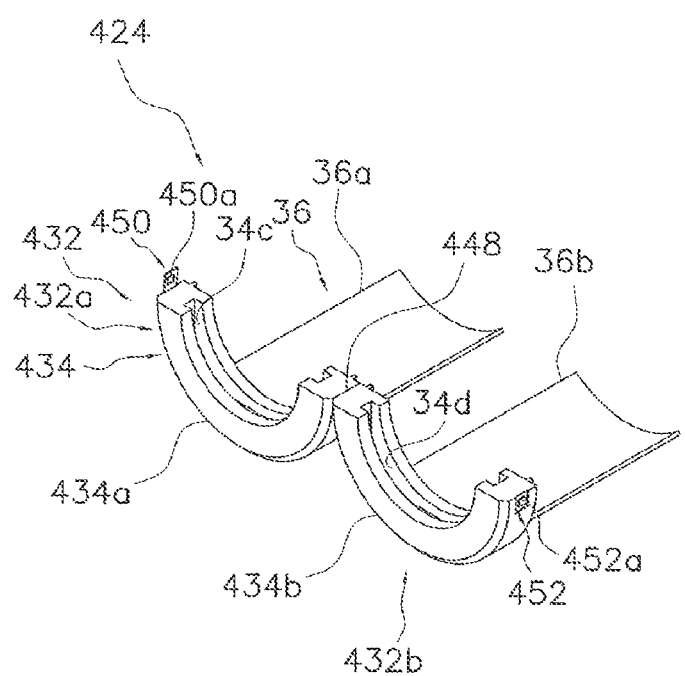
FIG. 14 is a perspective view of a bicycle component assembly according to a fourth modification of the first embodiment.

In the fourth modification, as shown in FIG. 14, a first bracket 432a and a second bracket 432b of a bracket 432 of a bicycle component fixing structure 424 are flexibly connected. Specifically, a connecting portion 434 includes a first connecting portion 434a and a second connecting portion 434b. The first connecting portion 434a and the second connecting portion 434b are included in a connecting portion 434 are flexibly connected. A bending portion 448 is formed between the first connecting portion 434a and the second connecting portion 434b. The bending portion 448 flexibly connects the first connecting portion 434a and the second connecting portion 434b. An elastic connecting protrusion 450 is formed on the outer perimeter part of the first connecting portion 434a. The elastic connecting protrusion 450 has a connecting opening 450a. The first connecting portion 434a is distant from the second connecting portion 434b so as to protrude in the circumferential direction. A connecting recess 452 is formed recessed on the outer perimeter part of the second connecting portion 434b. The connecting recess 452 has a connecting protrusion 452b, that elastically engages the connecting opening 450a. The second connecting portion 434b is distant from the first connecting portion 434a.

When connecting the bicycle component 22 with the bicycle component fixing structure 424 is configured in this manner, the first groove 34c is engaged with the connected portion 22c of the bicycle component 22. Next, the second connecting portion 434b is bent and the elastic connecting protrusion 450 is elastically engaged with the connecting recess 452. The connected portion 22c of the bicycle component 22 is thereby engaged with the second groove 34d, and the bicycle component 22 and the bracket 432 are connected.

Other Embodiments

One embodiment of the present invention was described above, but the present invention is not limited to the above-described embodiment, and various modifications can be made without departing from the scope of the invention. Especially, the various embodiments and modifications described in the present Specification can be freely combined according to necessity.

(a) In the above-described embodiment, the handlebar 12c and the seat post 12e were shown as examples of cylindrical portions of the bicycle having open ends. However, the cylindrical portion is not limited to the handlebar 12c and the seat post 12e. For example, the handlebar can be a hollow flat handlebar, or a hollow up handlebar. The handlebar can also be the front fork 12d or the cylindrical portion of the handle stem 12f.

(b) In the above-described embodiment, a pressing force acted on the fixing portion with bar tape 50, but the present invention is not limited thereto. For example, in the case of a flat handlebar, the pressing force can act on the outer peripheral surface 12h of the cylindrical portion 12b by a cylindrical grip that has elasticity. Further, a plurality of fixing portions can be formed of metallic elastic members, the distal end portions of the fixing portions configured to be smaller in diameter than the cylindrical portion, and the pressing force can act on the outer peripheral surface 12h of the cylindrical portion 12b by the elasticity of the member.

(c) In the above-described first embodiment, the first connecting portion 34a and the second connecting portion 34b respectively comprise the first groove 34c and the second groove 34d, which engage the connected portion 22c of the bicycle component 22, but the invention is not limited thereto. For example, as in the first modification described above, the bicycle component 22 can comprise an abutting portion that is provided on a surface of the connected portion 22c that faces the direction in which the central axis CL of the cylindrical portion 12b extends, and the abutting portion can be configured to abut an annular contact surface that is formed by the first connecting portion 34a and the second connecting portion 34b. Furthermore, the abutting portion of the connected portion 22c and the back surface on the opposite side can be configured to abut the open end 12a.

(d) In the above-described first embodiment, the bicycle component 22 comprises all of the operating unit 26, the electrical connection part 28, and the display unit 30, but the invention is not limited thereto. For example, the bicycle component 22 can be a rechargeable bicycle power source 16 comprising at least a display unit 30.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

As used herein, the following directional terms "frame facing side", "non-frame facing side", "forward", "rearward", "front", "rear", "up", "down", "above", "below", "upward", "downward", "top", "bottom", "side", "vertical", "horizontal", "perpendicular" and "transverse" as well as any other similar directional terms refer to those directions of a bicycle in an upright, riding position and equipped with the bicycle component. Accordingly, these directional terms, as utilized to describe the bicycle component should be interpreted relative to a bicycle in an upright riding position on a horizontal surface and that is equipped with the bicycle component. The terms "left" and "right" are used to indicate the "right" when referencing from the right side as viewed from the rear of the bicycle, and the "left" when referencing from the left side as viewed from the rear of the bicycle.

Also it will be understood that although the terms "first" and "second" may be used herein to describe various components these components should not be limited by these terms. These terms are only used to distinguish one component from another. Thus, for example, a first component discussed above could be termed a second component and vice versa without departing from the teachings of the present invention. The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A bicycle component fixing structure comprising:
   at least one bracket including at least one connecting portion that is connected to a bicycle component, and at least one fixing portion that extends from the at least one connecting portion and that is fixed with respect to an outer peripheral surface of a cylindrical portion of a bicycle that has an open end;
   the at least one fixing portion comprising at least one inner surface that opposes the outer peripheral surface of the cylindrical portion, and at least one outer surface that faces in an opposite direction from the at least one inner surface;
   the at least one fixing portion is fixed to the outer peripheral surface of the cylindrical portion by a pressing force that acts on the at least one outer surface; and
   the at least one bracket is configured to fix the bicycle component to the open end of the cylindrical portion in a state in which the at least one fixing portion is fixed to the outer peripheral surface of the cylindrical portion.

2. The bicycle component fixing structure according to claim 1, wherein
   the at least one bracket comprises a first bracket and a second bracket;
   the at least one connecting portion comprises a first connecting portion provided on the first bracket and a second connecting portion provided on the second bracket; and
   the at least one fixing portion comprises a first fixing portion provided on the first bracket and a second fixing portion provided on the second bracket.

3. The bicycle component fixing structure according to claim 2, wherein
   the first connecting portion and the second connecting portion are connected to the bicycle component in a state in which the bicycle component is disposed between the first bracket and the second bracket.

4. The bicycle component fixing structure according to claim 2, wherein
   the bicycle component comprises a connected portion that extends in a radial direction that is perpendicular to a direction in which a central axis of the cylindrical portion extends; and
   the first connecting portion and the second connecting portion are connected to the connected portion.

5. The bicycle component fixing structure according to claim 2, wherein
   the bicycle component comprises an abutting portion that is provided on a surface that faces a direction in which a central axis of a cylindrical portion extends; and
   the abutting portion abuts the at least one connecting portion.

6. The bicycle component fixing structure according to claim 2, wherein
   the first fixing portion comprises a first inner surface that opposes the outer peripheral surface of the cylindrical portion and a first outer surface that faces in an opposite direction from the first inner surface; and
   the second fixing portion comprises a second inner surface that opposes the outer peripheral surface of the cylindrical portion and a second outer surface that faces in an opposite direction from the second inner surface.

7. The bicycle component fixing structure according to claim 6, wherein
   the first fixing portion and the second fixing portion are fixed to the outer peripheral surface of the cylindrical portion by a first double-sided tape that is disposed between the first inner surface and the outer peripheral surface of the cylindrical portion, and a second double-sided tape that is disposed between the second inner surface and the outer peripheral surface of the cylindrical portion.

8. The bicycle component fixing structure according to claim 2, wherein the first bracket comprises a first abutting portion;
the second bracket comprises a second abutting portion; and
the first abutting portion abuts the second abutting portion in a state in which the bicycle component is fixed to the cylindrical portion.

9. The bicycle component fixing structure according to claim 2, wherein
the first bracket and the second bracket are independent and separate parts from each other.

10. The bicycle component fixing structure according to claim 2, wherein
the first bracket and the second bracket are flexibly connected.

11. The bicycle component fixing structure according to claim 1, wherein the cylindrical portion is a handlebar.

12. The bicycle component fixing structure according to claim 1, wherein
the pressing force is generated by winding a strip-shaped tape member onto the at least one outer surface of the at least one fixing portion.

13. The bicycle component fixing structure according to claim 1, wherein
the bicycle component comprises at least one of an operating unit, an electrical connection part and a display unit.

14. The bicycle component fixing structure according to claim 1, wherein
the bicycle component is a bicycle power source that is configured to supply power to another bicycle component.

15. A bicycle component assembly comprising:
a bicycle component comprising a connected portion and at least one of an operating unit, an electrical connection part and a display unit;
at least one bracket comprising at least one connecting portion that is connected to the bicycle component, and at least one fixing portion that extends from the at least one connecting portion and that is fixed with respect to an outer peripheral surface of a cylindrical portion of a bicycle that has an open end;
the at least one fixing portion comprises at least one inner surface that opposes the outer peripheral surface of the cylindrical portion, and at least one outer surface that faces in an opposite direction from of the at least one inner surface;
the at least one fixing portion is fixed to the outer peripheral surface of the cylindrical portion by a pressing force that acts on the at least one outer surface; and
the at least one bracket is configured to fix the bicycle component to the open end of the cylindrical portion in a state in which the at least one fixing portion is fixed to the outer peripheral surface of the cylindrical portion.

16. The bicycle component assembly according to claim 15, wherein
the at least one bracket comprises a first bracket and a second bracket,
the at least one connecting portion comprises a first connecting portion provided on the first bracket and a second connecting portion provided on the second bracket; and
the at least one fixing portion comprises a first fixing portion provided on the first bracket and a second fixing portion provided on the second bracket.

17. The bicycle component assembly according to claim 16, wherein
the first connecting portion and the second connecting portion are connected to the bicycle component in a state in which the bicycle component is disposed between the first bracket and the second bracket.

18. The bicycle component assembly according to claim 16, wherein
the connected portion extends in a radial direction that is perpendicular to a direction in which a central axis of the cylindrical portion extends; and
the first connecting portion and the second connecting portion are connected to the connected portion.

19. The bicycle component assembly according to claim 16, wherein
the bicycle component comprises an abutting portion that is provided on a surface that faces in a direction in which a central axis of the cylindrical portion extends; and
the abutting portion abuts the at least one connecting portion.

20. The bicycle component assembly according to claim 16, wherein
the first fixing portion comprises a first inner surface that opposes the outer peripheral surface of the cylindrical portion and a first outer surface that faces in an opposite direction from the first inner surface; and
the second fixing portion comprises a second inner surface that opposes the outer peripheral surface of the cylindrical portion and a second outer surface that faces in an opposite direction from the second inner surface.

21. The bicycle component assembly according to claim 20, wherein
the first fixing portion and the second fixing portion are fixed to the outer peripheral surface of the cylindrical portion by a first double-sided tape that is disposed between the first inner surface and the outer peripheral surface of the cylindrical portion, and a second double-sided tape that is disposed between the second inner surface and the outer peripheral surface of the cylindrical portion.

22. The bicycle component assembly according to claim 16, wherein
the first bracket comprises a first abutting portion;
the second bracket comprises a second abutting portion; and
the first abutting portion abuts the second abutting portion in a state in which the bicycle component is fixed to the cylindrical portion.

23. The bicycle component assembly according to claim 16, wherein
the first bracket and the second bracket are independent and separate parts from each other.

24. The bicycle component assembly according to claim 15, wherein
the at least one bracket is flexibly connected.

25. The bicycle component assembly according to claim 15, wherein
the at least one bracket is integrally formed with the bicycle component.

26. The bicycle component assembly according to claim 15, wherein
the cylindrical portion is a handlebar.

27. The bicycle component assembly according to claim 15, wherein
the pressing force is generated by winding a strip-shaped tape member onto the at least one outer surface of the at least one fixing portion.

28. The bicycle component assembly according to claim 15, wherein
the bicycle component is a bicycle power source that is configured to supply power to another bicycle component.

* * * * *